United States Patent
Takenaka et al.

[11] Patent Number: 6,004,474
[45] Date of Patent: Dec. 21, 1999

[54] PIEZOELECTRIC CERAMIC COMPOSITION

[75] Inventors: Tadashi Takenaka; Masakazu Hirose; Kazuo Miyabe, all of Chiba, Japan

[73] Assignee: TDK Corporation, Tokyo, Japan

[21] Appl. No.: 09/040,310

[22] Filed: Mar. 18, 1998

[30] Foreign Application Priority Data

Mar. 28, 1997 [JP] Japan .................................... 9-095032

[51] Int. Cl.$^6$ .............................................. C04B 35/453
[52] U.S. Cl. ...................................... 252/62.9 R; 501/134
[58] Field of Search ........................ 501/134; 252/62.9 R

[56] References Cited

U.S. PATENT DOCUMENTS 5,637,542  6/1997  Takenaka ................................ 501/134

OTHER PUBLICATIONS

Nagata et al, "Lead–Free Piezoelectric Ceramics of (Bi1/2Na1/2)TiO3–1/2(Bi2O3–Sc2O3) System", Jpn. J. Appl. Phys., vol. 36 (9B), 6055–57, Sep. 1997.
Chemical Abstract Citation 129:61211: :Nagata et al, "(Bi1/2Na1/2)TiO3–Based Non–Lead Piezoelectric Ceramics", J. Korean Phys. Soc. vol. 32, 1998 no month.
Tadashi Takenaka, et al., Japanese Journal of Applied Physics, vol. 30, No. 9B, pp. 2236 to 2239, "(Bi$_{1/2}$Na$_{1/2}$)TiO$_3$–BaTiO$_3$ System For Lead–Free Piezoelectric Ceramics", Sep. 1991.
Tadashi Takenaka, et al., Silicates Industriels, pp. 136 to 142, "Mechanical Properties of (Bi$_{1/2}$Na$_{1/2}$)TiO$_3$–Based Piezoelectric Ceramics", 1993/Jul.–Aug.

*Primary Examiner*—C. Melissa Koslow
*Attorney, Agent, or Firm*—Oblon, Spivak, McClelland, Maier & Neustadt, P.C.

[57] ABSTRACT

One object of the present invention is to provide a lead-free piezoelectric material excellent in piezoelectric characteristics and superior from the viewpoints of prevention of environmental pollution, protection of environments and ecology. To achieve the object, a piezoelectric ceramic composition is constructed from a piezoelectric ceramic composition within a region in case of being represented by the formula:

$$x[Bi_{1/2}Na_{1/2}]TiO_3\text{-}y[MeNbO_3]\text{-}(z/2)[Bi_2O_3.Sc_2O_3]$$

(wherein Me is K or Na)
wherein X, y and z satisfy the following conditions:
  x+y+z=1, 0<x<1, 0≦y<1, 0<z<0.5.

7 Claims, 6 Drawing Sheets

PIEZOELECTRIC CERAMIC COMPOSITION

BACKGROUND OF THE INVENTION

The present invention relates to a piezoelectric material extensively used in the fields of actuator, sensor, resonator, etc.

A piezoelectric material is a material having an effect of generating strain when an electric field is applied from outside (conversion of electrical energy to mechanical energy) and an effect of generating an electrical charge on the surface thereof when a stress is applied thereto from outside, and extensively in use in the fields of actuator, sensor and the like. For instance, a piezoelectric material of PZT type (lead zirconate titanate) generates a strain roughly proportional to the input voltage at order of $10^{-10}$ m/V, and therefore is successfully applicable to microscopic adjustment of position, etc. and utilized in the fine adjustment of optical systems. Also, since it generates electrical charge of which magnitude is proportional to the applied stress or deformation of piezoelectric material itself, it is utilizable as a sensor for reading out a minute force or deformation. Further, since a piezoelectric material is excellent in responsibility, it is also possible to excite a piezoelectric material itself or an elastic material in a conjunctive relation with a piezoelectric material and thereby to cause a resonance by applying an alternating electric field.

Most of the piezoelectric materials practically in use today belong to a solid solution system (a PZT system) consisting of $PbZrO_3(PZ)$—$PbTiO_3(PT)$. This is for the reason that a material of excellent piezoelectric characteristics can be obtained by using a composition close to the crystallographic morphotropic phase boundary (M.P.B.) between trigonal PZ system and tetragonal PT system. In the field of PZT, products of wide composition range capable of replying the various needs have been developed by adding various additives or subsidiary components to M.P.B. composition. The products thus developed cover a wide variety of ones ranging from those used in position-adjusting actuator capable of indicating a large displacement when used in a direct current because of small mechanical quality factor (Qm) and great piezoelectric constant (d33) to those suitable for use in alternating current such as ultrasonic wave-emitting element or ultrasonic motor or the like because of small piezoelectric constant (d33) and large mechanical quality factor (Qm).

In addition to the above, most of the piezoelectric and electrically strainable materials practically used currently have a solid solution composition of which main component is lead type perovskite composition such as PZT, PMN (lead magnesium-niobate) or others.

Now, these lead type piezoelectric materials contain so large an amount of lead oxide (PbO) as about 60–70% by weight, showing a high volatility even at low temperatures, as main component. For instance, in PZT and PMN, about ⅔ by weight of the total weight is occupied by lead oxide. In the manufacture of ceramics or single crystal of these piezoelectric materials, heat treatments such as firing, fusion, etc. are indispensable processes. When these heat-treatments are carried out on an industrial scale, a large quantity of the volatile lead oxide is lost by vaporization or diffusion into atmospheric air. Although the lead oxide released in the process of manufacture can be recovered, the lead oxide present in the industrial piezoelectric materials released into the market can hardly be recovered at the present time. If such a large quantity of lead oxide is released into environments, it unavoidably causes pollution of environment in the form of, for instance, acidic rain, etc. In view of the enlargement of application field of piezoelectric ceramics and single crystals and increased consumption thereof, the problem of development of pollution-free or lead-free piezoelectric material is very important.

As piezoelectric materials entirely free from lead, there are known $BaTiO_3$ and Bi-layer ferroelectric substances. However, the former has so low a Curie temperature as 120° C. above which its piezoelectricity disappears, so that this type of piezoelectric material is not practical for uses in cars or/and the like. The latter usually has a Curie temperature of above 400° C., and is superior in heat stability. However, it is high in crystalline anisotropy and its spontaneous polarization has to be oriented by the method of hot forging or the like, which is undesirable from the viewpoint of productivity. Further, if the content of lead is made to zero, a high piezoelectricity is difficult to obtain.

SUMMARY OF THE INVENTION

It is an object of the present invention to provide a lead-free piezoelectric material displaying excellent piezoelectric characteristics which is superior from the viewpoint of prevention of environmental pollution, protection of environments and ecology.

The object mentioned above can be achieved by the following construction:

(1) A piezoelectric ceramic composition within a region in a case of being represented by the following formula:

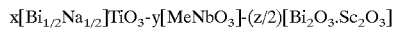

$$x[Bi_{1/2}Na_{1/2}]TiO_3 - y[MeNbO_3] - (z/2)[Bi_2O_3 \cdot Sc_2O_3]$$

wherein Me is K or Na, which satisfies the following conditions:

$x+y+z=1$ $0<x<1$ $0 \leq y<1$ and $0<z<0.5$.

(2) The piezoelectric ceramic composition of Paragraph (1), wherein x, y and z are in the ranges satisfying the following conditions:

$0.7 \leq x<1$ $0 \leq y \leq 0.2$ and $0<z \leq 0.3$.

(3) The piezoelectric ceramic composition of Paragraph (1), wherein Me is K and x, y and z are in the ranges satisfying the following conditions:

$0<x<0.1$, $0.9 \leq y<1$ and $0<z<0.1$.

DESCRIPTION OF THE PREFERRED EMBODIMENTS

Figure 1:
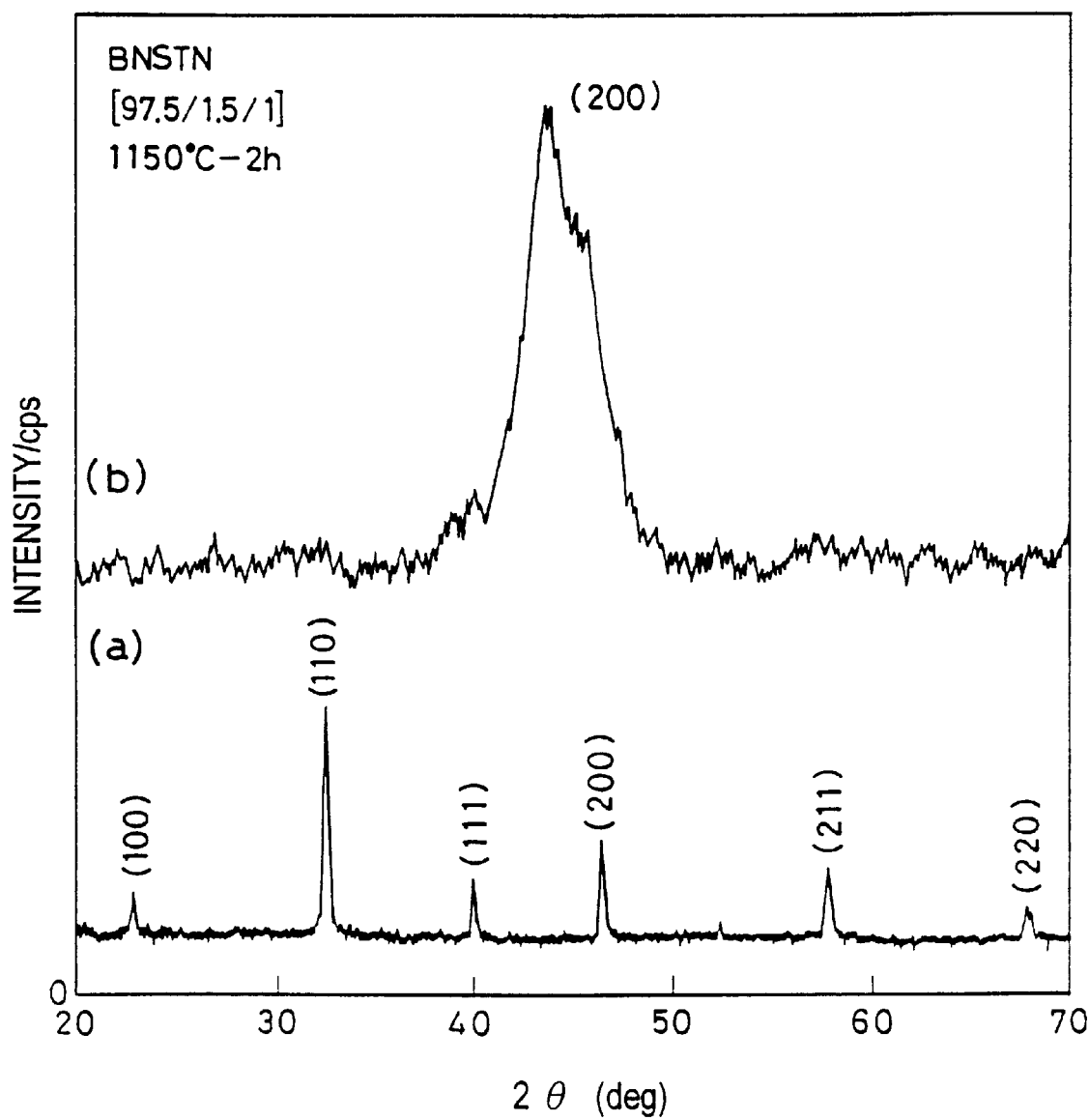
FIG. 1 is a chart illustrating the results of X-ray diffraction of Sample No. 1, wherein (b) is magnified view of (a) in the neighborhood of 45°.

The piezoelectric ceramic composition of the present invention is within a region in a case of being represented by the following formula:

$x[Bi_{1/2}Na_{1/2}]TiO_3-y[MeNbO_3]-(z/2)[Bi_2O_3 \cdot Sc_2O_3]$ wherein Me is K or Na, and x, y and z are in the ranges satisfying the following conditions:

$x+y+z=1$ $0<x<1$ $0 \leq y<1$ and $0<z<0.5$.

Having the above-mentioned ternary composition ratio, the piezoelectric material of the present invention exhibits excellent piezoelectric characteristics. That is $[Bi_{1/2}Na_{1/2}]TiO_3$ (BNT system), is a ferroelectric substance having a Curie temperature of 320° C. and its crystal structure is trigonal perovskite type. $MeNbO_3$ has a rhombic perovskite crystal structure. By forming a solid solution from such a trigonal perovskite type dielectric and a rhombic perovskite type dielectric, excellent piezoelectric characteristics can be exhibited. By further adding $[Bi_2O_3 \cdot Sc_2O_3]$ thereto, the trivalent Sc replaces the $[Bi_{1/2}Na_{1/2}]Ti$ of BNT. When composition ratio is in some range, the transition point of piezo-electricity shifts to the higher region (by about 200° C. to about 230° C.), and temperature-dependent characteristics of piezoelectricity is improved. Further, since the composition is entirely free from lead, no vaporization of lead takes place at the time of firing and the risk of releasing lead into environments after circulation into market can be eliminated, so that the piezoelectric ceramic composition thus obtained is quite excellent from the viewpoint of prevention of environmental pollution, protection of environments and ecology.

Sum of the composition ratios x, y and z of the components is 1. While y can be zero, x and z cannot be zero. Although lower limit thereof is not critical, it is usually about 0.001. When z is above 0.5, sintering characteristics are not good, and sintering is difficult to practice.

The composition ratios x, y and z preferably satisfy the following conditions:

$0.7 \leq x<1$, $0 \leq y \leq 0.2$ $0<z \leq 0.3$, and further preferably the following conditions:

$0.95 \leq x<1$, $0 \leq y \leq 0.03$, and $0<z \leq 0.04$, and particularly preferably the following conditions:

$0.96 \leq x<1$, $0 \leq y \leq 0.025$, and $0<z \leq 0.04$.

Otherwise, when Me is K, the following conditions:

$0<x<0.1$, $0.9 \leq y<1$, and $0<z<0.1$ may be satisfied.

$MeNbO_3$ may be any of $KNbO_3$ and $NaNbO_3$. Since $KNbO_3$ is a ferroelectric substance, piezoelectric characteristics can be improved by its addition. However, when its amount is in some range, sintering temperature can descend. Since $NaNbO_3$ is a antiferroelectric at ambient temperature, too large an amount of $NaNbO_3$ can deteriorate piezoelectric characteristics. The quantities of the oxides in the above-mentioned composition may deviate by about ±10% from the stoichiometric composition ratio.

Further, in addition to the composition mentioned above, Mn and the like may be added as additives. By addition of such additives, mechanical quality factor Qm can greatly be improved. Quantities of these additives are preferably 0.005–1% by weight, further preferably 0.2–0.8% by weight and particularly preferably 0.4–0.7% by weight, based on the weight of composition. It is considered that these additives replace Ti of $[Bi_{1/2}Na_{1/2}]TiO_3$. However, the additives may replace other parts or be present at the grain boundary. Usually, additives such as Mn are added in the form of $MnCO_3$ or oxide such as, $MnCO_4$, etc.

Next, the method for manufacturing the piezoelectric ceramic composition of the present invention will be explained.

As starting material, powdery materials of bismuth oxide $(Bi_2O_3)$, sodium carbonate $(Na_2CO_3)$, potassium carbonate $(K_2CO_3)$, niobium oxide $(Nb_2O_5)$, titanium oxide $(TiO_2)$, etc. are used. The starting materials which have been sufficiently dried preferably at a temperature of 100° C. or above are weighed out so that the final composition becomes falling in the scope of the present invention, and thoroughly mixed together by means of ball mill in an organic solvent for 5–20 hours. The homogenized powdery material is thoroughly dried and then formed by means of a press and calcined at about 750–900° C. for 1–3 hours. The calcined product is pulverized by means of a ball mill for 10–30 hours and then again dried. After adding a binder, the material is granulated, and the granulated material is molded by means of press to form a pellet. The pellet is heat-treated at 400–600° C. for about 2–4 hours to vaporize off the binder, and then sintered at about 950–1,300° C. for about 2–4 hours. The temperature-elevating and -lowering speeds are both 80–150° C. per minute. If desired, the piezoelectric ceramic composition obtained by the sintering is ground, if desired, and electrodes is attached thereto. Then, an electric field of 5–10 MV/m is applied for a period of 5 minutes to one hour in silicone kept at 25–100° C. for the sake of polarization treatment.

In the piezoelectric ceramic composition of the present invention, the crystal grain has a mean particle diameter of 0.5–10 $\mu$m, preferably 1–5 $\mu$m, and particularly about 3 $\mu$m, with a perovskite structure.

EXAMPLES

Experimental Example 1

As starting materials, powdery bismuth oxide $(Bi_2O_3)$, sodium carbonate $(Na_2CO_3)$, niobium oxide $(Nb_2O_3)$ and titanium oxide $(TiO_3)$ were used. After sufficiently drying the powdery materials at a temperature not lower than 100° C., the materials were weighed out so that the quantity of $KNbO_3$ comes to 0–7 mol % based on $[Bi_{1/2}Na_{1/2}]TiO_3$, and mixed together in acetone solvent in a ball mill using zirconia balls for about 10 hours. The homogenized powdery materials were sufficiently dried and then molded by means of a press, and calcined at 800° C. for 2 hours. The calcined material was pulverized in a ball mill for about 20 hours, and again dried. After adding PVA (polyvinyl alcohol) as a binder, the mixture was granulated. The granulated powder was formed into a disk-form pellet having a diameter of 20 mm and a thickness of 1.5 mm by applying a weight of $10 \times 10^6$ to $20 \times 10^6$ Pa by means of a single screw press molding machine. The formed sample was heat-treated at 500° C. for 3 hours to evaporate off the binder, and then sintered at 950–1,300° C. for 2–4 hours. The speeds of temperature elevation and temperature lowering were both 100° C./minute. The sample obtained by the proper firing was ground into parallel plates having a thickness of about 0.4 to 0.5 mm, and then silver paste was coated and baked at 550° C. to form electrodes. After a polarization treatment, the plates were cut into a size of 2 mm×2 mm to obtain samples for evaluation.

Figure 8:
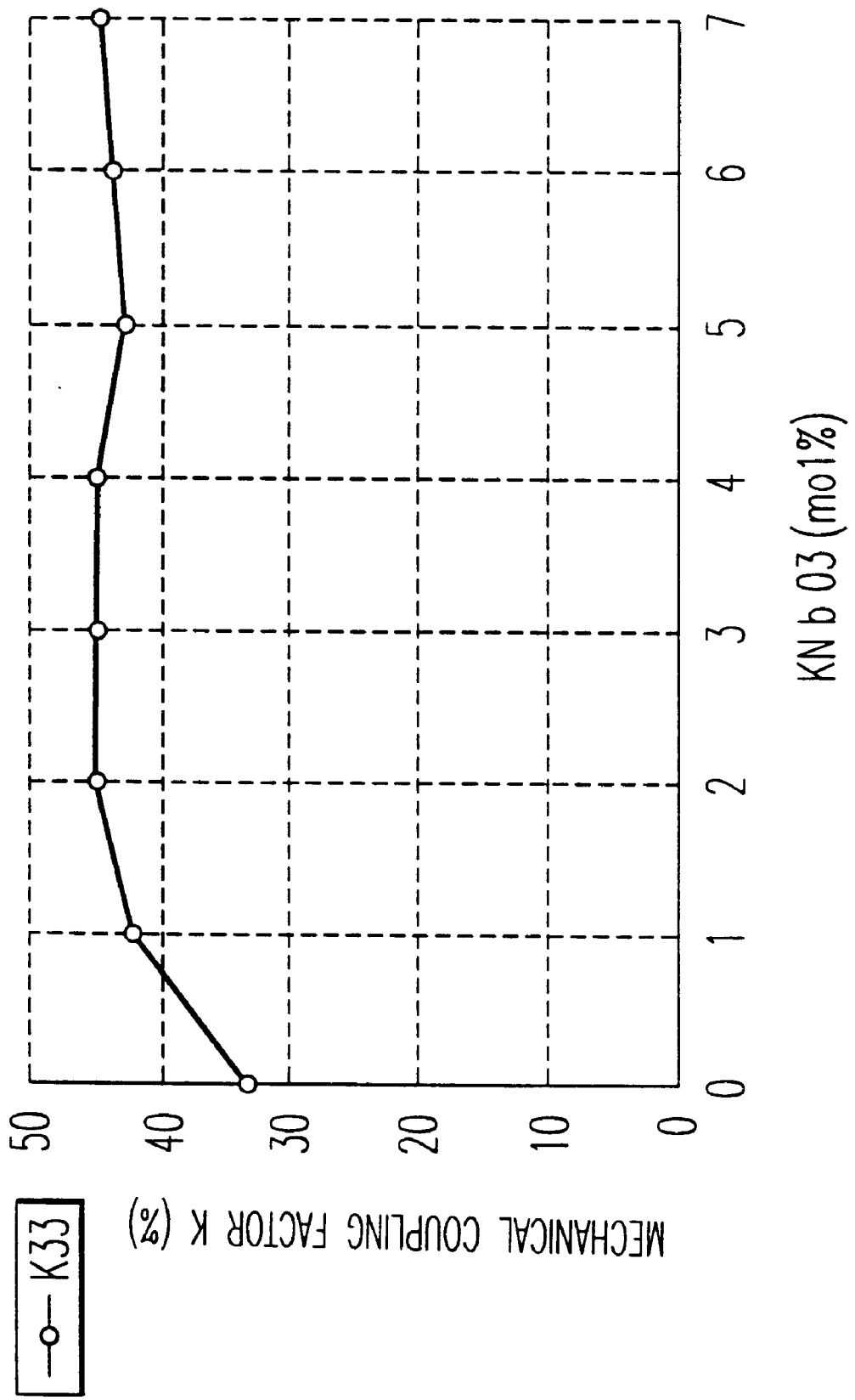
FIG. 8 is a graph illustrating the relation between the quantity of addition of $KNbO_3$ and mechanical coupling factor K33.

On the samples thus obtained, mechanical coupling factor K33 was measured. The results are shown in FIG. 8. It is apparent from FIG. 8 that the mechanical coupling factor is improved by addition of $KNbO_3$.

Example 1

As starting materials, powdery bismuth oxide ($Bi_2O_3$), sodium carbonate ($Na_2CO_3$), niobium oxide ($Nb_2O_3$) and titanium oxide ($TiO_2$) were used. After sufficiently drying the powdery materials at a temperature not lower than 100° C., the materials were weighed out so that the composition ratio coincided with that shown in Table 1, and mixed together in acetone solvent in a ball mill using zirconia balls for about 10 hours. The homogenized powdery materials were sufficiently dried and then molded by means of a press, and calcined at 800° C. for 2 hours. The calcined material was pulverized in a ball mill for about 20 hours, and again dried. After adding PVA (polyvinyl alcohol) as a binder, the mixture was granulated. The granulated powder was formed into a disk-form pellet having a diameter of 20 mm and a thickness of 1.5 mm by applying a weight of $10 \times 10^6$ to $20 \times 10^6$ Pa by means of a single screw press molding machine. The formed sample was heat-treated at 500° C. for 3 hours to evaporate off the binder, and then sintered at 950–1,300° C. for 2–4 hours. The speeds of temperature elevation and temperature lowering were both 100° C./minute. The sample obtained by the sintering was ground into parallel plates having a thickness of about 0.4 to 0.5 mm, and then silver paste was coated and baked at 550° C. to form electrodes.

On the piezoelectric material samples No. 1 to No. 7 thus obtained, Curie temperature, hysteresis characteristics and piezoelectric characteristics were measured. The hysteresis characteristics were evaluated by observing the D-E hysteresis loop at 50 Hz by means of Sawyer-Tower circuit to determine remanent polarization and coersive field. The piezoelectric characteristics were evaluated by measuring the electromechanical coupling factor by the resonance-antiresonance technique by means of an automatic measuring system using LF impedance analyzer (YHP4192A) and desktop computer. The results are shown in Table 1.

Comparative Example 1

Sample No. 8 was prepared by repeating Example 1, except that barium titanate ($BaTiO_3$) was used as the starting material. Sample No. 8 thus obtained was examined for residual polarization and electromechanical coupling factor in the same manner as in Example 1. The results are shown in Table 1.

Comparative Example 2

Sample No. 9 was prepared by repeating Example 1, except that $Na_{0.5}LaBi_{3.5}Ti_4O_{15}$ was used as the starting material. Sample No. 9 thus obtained was examined for residual polarization and electromechanical coupling factor in the same manner as in Example 1. The results are shown in Table 1.

TABLE 1

| Sample No. | Composition | | | Curie temp. (° C.) | Hysteresis Coersive field (kV/cm) | Hysteresis Remanent polarization ($\mu C/cm^2$) | Electromechanical coupling factor K33 (%) | Conditions of polarization |
|---|---|---|---|---|---|---|---|---|
| | x | y | z | | | | | |
| 1 | 0.975 | 0.015 | 0.010 | — | 19.10 | 13.23 | 28.13 | 25° C.-9 kV/mm-15 min |
| 2 | 0.980 | 0.010 | 0.010 | — | 24.61 | 17.57 | 34.36 | 25° C.-8 kV/mm-15 min |
| 3 | 0.980 | 0.010 | 0.010 | — | 24.61 | 17.57 | 36.67 | 25° C.-9 kV/mm-15 min |
| 4 | 0.990 | 0 | 0.010 | 346 | 31.70 | 15.78 | 40.37 | 25° C.-8 kV/mm-15 min |
| 5 | 0.980 | 0 | 0.020 | 358 | 42.20 | 33.41 | 40.07 | 25° C.-8 kV/mm-15 min |
| 6 | 0.970 | 0 | 0.030 | 356 | 23.55 | 27.39 | 39.32 | 25° C.-8 kV/mm-15 min |
| 7 | 0.960 | 0 | 0.040 | — | — | — | 35.00 | 25° C.-8 kV/ mm-15 min |
| 8* | $BaTiO_3$ | | | 120 | — | — | 49.30 | — |
| 9* | $Na_{0.5}LaBi_{3.5}Ti_4O_{15}$ | | | 402 | — | — | 10.10 | — |

*Comparative examples

It is apparent from Table 1 that the samples of the present invention have a thermally stable Curie temperature and give a greater mechanical coupling factor as compared with other lead-free piezoelectric ceramics such as $BaTiO_3$ and $Na_{0.5}LaBi_{3.5}Ti_4O_{15}$.

Example 2

A Sample was prepared in the same manner as in Example 1, except that sodium carbonate ($Na_2CO_3$) used in Example 1 was replaced with potassium carbonate ($K_2CO_3$), and the sample thus obtained was evaluated in the same manner as in Example 1. As a result, an improvement in mechanical coupling factor was observed as compared with the sample of Example 1.

Example 3

A sample was prepared by repeating Example 1, except that $(z/2)[Bi_2O3.Sc_2O_3]$ was added to $x[Bi_{1/2}Na_{1/2}]TiO_3$-y $[KNbO_3]$ so that x, y and z fall in the following ranges:

$0 < x < 0.1$ $0.9 \leq y\ 1$ and $0 < z < 0.1$.

The sample thus obtained was evaluated in the same manner as in Example 1. As a result, it was found that mechanical coupling factor and piezoelectric characteristics were more improved than in Experimental Example 1.

Example 4

Figure 2:
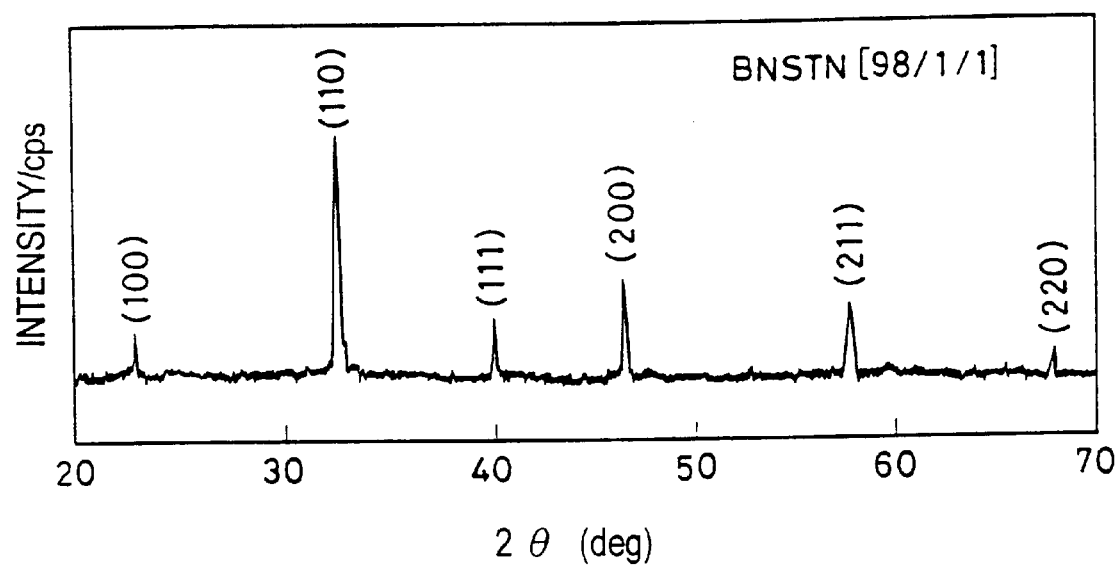
FIG. 2 is a chart illustrating the results of X-ray diffraction of Sample No. 3.

X-ray diffraction was measured on the No. 1 and No. 3 samples obtained in Example 1. The results are shown in FIGS. 1 and 2. In FIG. 1, (b) is magnified view of (a) in the neighborhood of 45°. A single phase of perovskite structure is noticeable there. Although whether the crystal structure is tetragonal or rhombohedral cannot be determined based on the peak behavior, the crystal structure is considered rhombohedral based on observation of high angle side of FIG. 1(a) because no division of peak is observable there. Next, each of the samples No. 1 and No. 3 was mixed with Si powder and the peak angle of X-ray diffraction was corrected, from which lattice constant was calculated. The results are shown in Table 2.

TABLE 2

| Sample No. | Lattice constant a = b = c(Å) | Theoretical density ρ(g/cm$^3$) | Found density ρ(g/cm$^3$) | Contraction rate (%) | Density ratio (%) | Crystal system |
|---|---|---|---|---|---|---|
| 1 | 3.8808 | 6.0045 | 5.7003 | 18.3 | 94.9 | Rhombohedral |
| 3 | 3.8808 | 6.0178 | 5.8378 | 21.0 | 97.0 | Rhombohedral |

It is apparent from Table 2 that density ratio of the piezoelectric ceramic composition of the present invention can be as great as near 95%. Based on this value of density ratio, excellence of piezoelectric characteristics can be expected, because as small a difference as 1% in the density ratio brings about a great influence upon piezoelectric characteristics.

Figure 3:
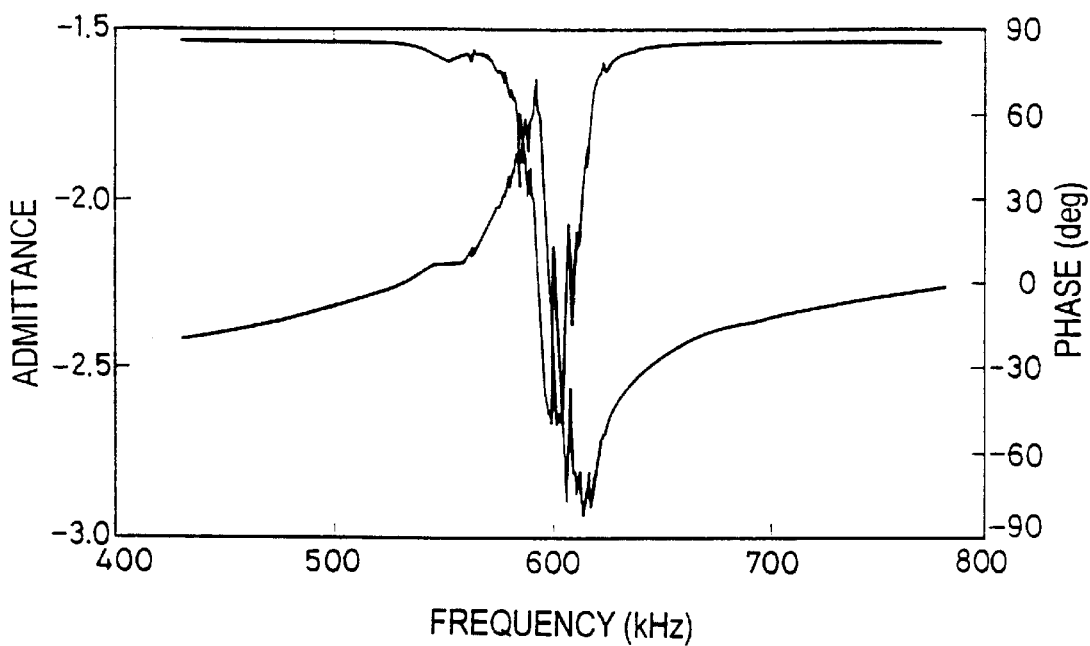
FIG. 3 is a graph illustrating the admittance-frequency characteristics of Sample No. 1.
Figure 4:
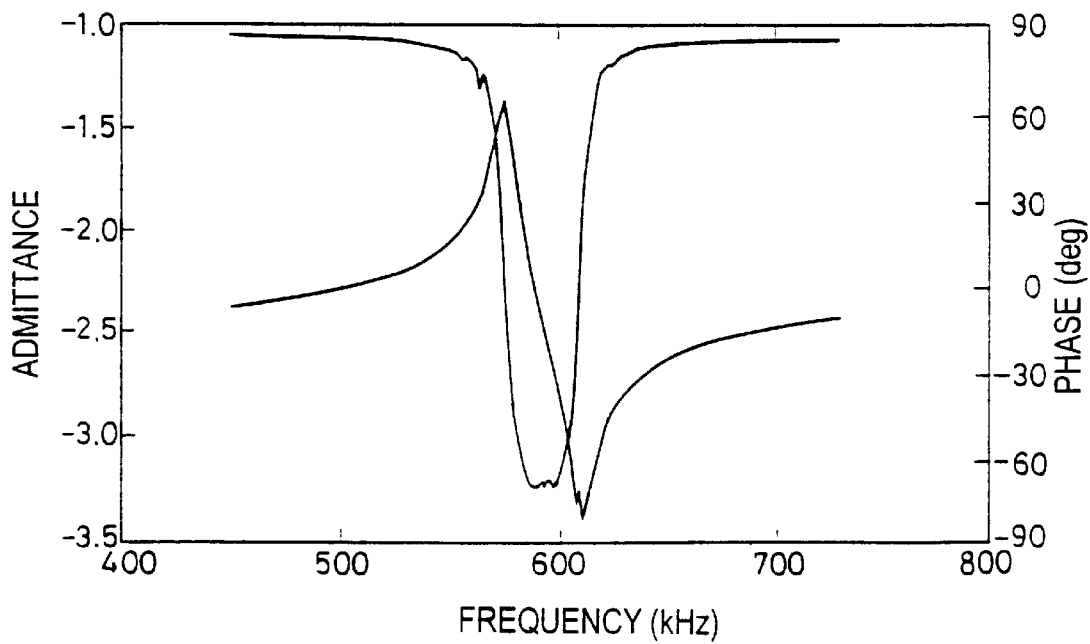
FIG. 4 is a graph illustrating the admittance-frequency characteristics of Sample No. 3.

Next, on each of sample No. 1 and sample No. 3, hysteresis characteristics at ambient temperature and 50 Hz under varied polarization conditions (electric field) and admittance frequency characteristics under a poling condition of Tp=25° C., tp=15 min. were measured, from which K33 and N33 were calculated. The piezoelectric characteristics thus determined are shown in Table 3 (mechanical quality factor is expressed as Qm), and admittance-frequency characteristics of sample No. 1 and sample No. 3 are shown in FIGS. 3 and 4.

TABLE 3

| Sample No. | Electric field (kV/cm) | K33 (%) | N33 (Hz · m) | Peak/Dip | Qm |
|---|---|---|---|---|---|
| 1 | 8 | 23.75 | 24.36 | 11.35 | 65.34 |
| 1 | 9 | 28.13 | 24.52 | 18.15 | 58.28 |

TABLE 3-continued

| Sample No. | Electric field (kV/cm) | K33 (%) | N33 (Hz · m) | Peak/Dip | Qm |
|---|---|---|---|---|---|
| 3 | 8 | 34.36 | 23.89 | 87.41 | 68.49 |
| 3 | 9 | 36.67 | 18.29 | 103.4 | 60.61 |

It is apparent from Table 3 that the piezoelectric ceramic compositions of the present invention have excellent mechanical quality factors.

Example 5

Samples were prepared in the same manner as in Example 1, except that starting materials were weighed out so as to give a final composition ratio of $x[Bi_{1/2}Na_{1/2}]TiO_3$-$y[KNbO_{3 1-(z/2)}][Bi_2O_3 \cdot Sc_2O_3]$ (x+y+z=1) wherein y=0 and z=0.02, 0.05 or 0.30.

Figure 5:
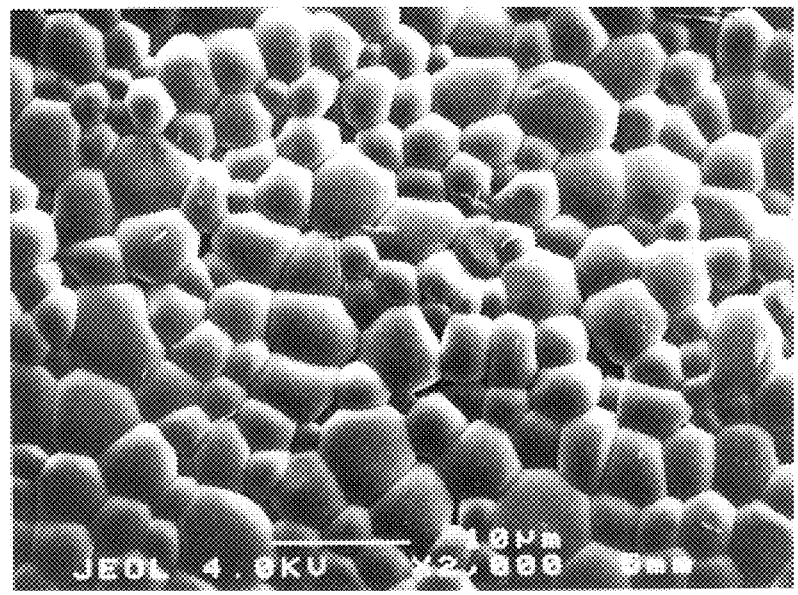
FIG. 5 is a SEM photograph of a sample of (½) $[Bi_2O_3 \cdot Sc_2O_3]$; z=0.02.
Figure 6:
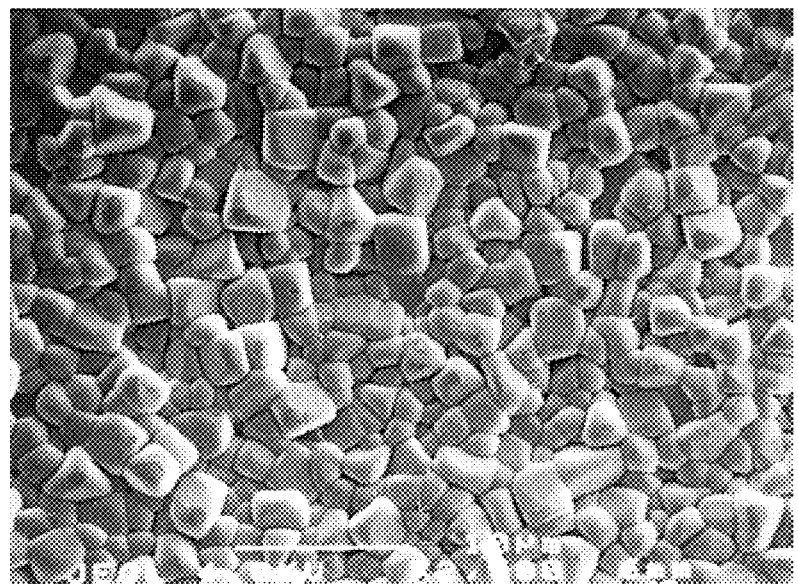
FIG. 6 is a SEM photograph of a sample of z=0.05.
Figure 7:
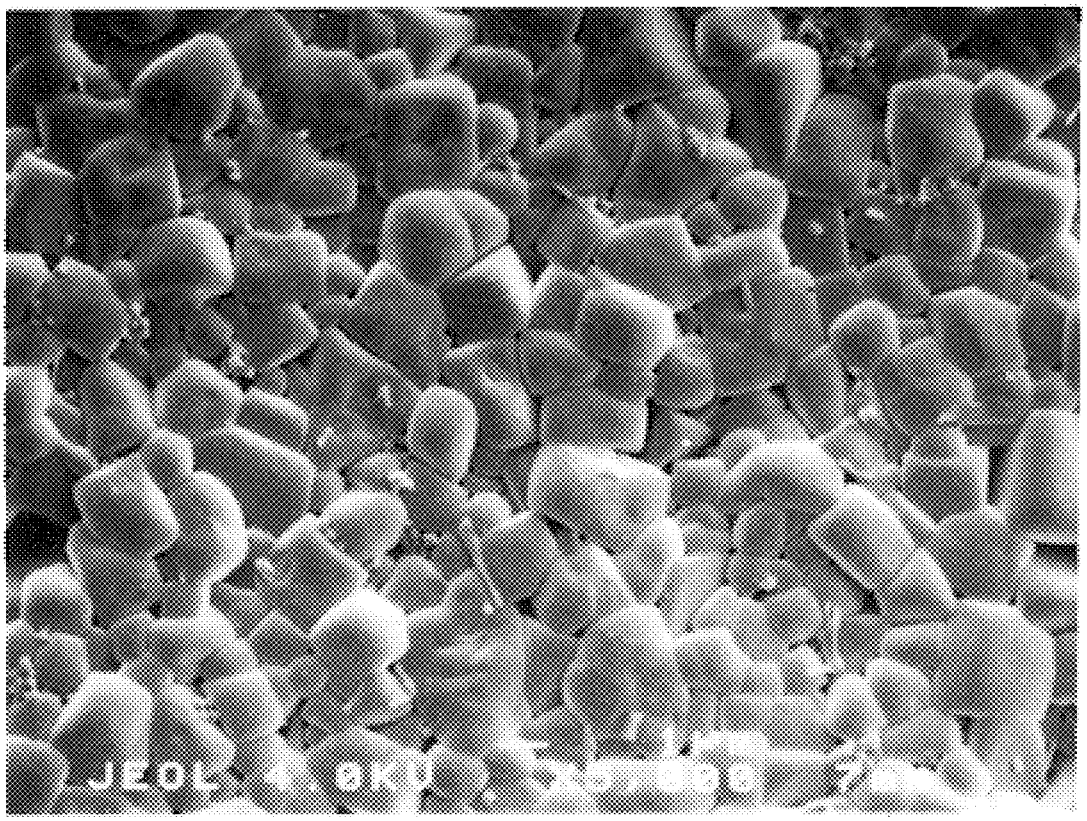
FIG. 7 is a SEM photograph of a sample of z=0.30.

Each sample was etched first at 1,050° C. for 2 hours and subsequently at 1,000° C. for 1 hour (30 minutes for the sample of z=30), and the surface was examined with scanning electron microscope (SEM). FIGS. 5–7 illustrate the SEM photographs of the surfaces of the samples.

Example 6

Samples were prepared in the same manner as in Example 1, except that powdery starting materials were weighed out so that the final formulation coincided with the formulations shown in Table 4.

On each of the piezoelectric material samples No. 11 to No. 21 thus obtained, Curie temperature was measured, and electromechanical coupling factor was measured by the resonance-antiresonance technique in the same manner as in Example 1. The results are summarized in Table 4.

TABLE 4

| Sample No. | Composition | | | Curie temperature (C. °) | Electro-mechanical coupling factor K33 (%) | Conditions of polarization |
|---|---|---|---|---|---|---|
| | x | y | z | | | |
| 11 | 0.99 | 0.005 | 0.005 | 328 | 43.4 | 25° C.-8 kV/mm-15 min |
| 12 | 0.98 | 0.010 | 0.010 | 332 | 42.4 | 25° C.-8 kV/mm-15 min |
| 13 | 0.97 | 0.015 | 0.015 | 324 | 41.4 | 25° C.-8 kV/mm-15 min |
| 14 | 0.96 | 0.020 | 0.020 | 316 | 40.1 | 25° C.-8 kV/mm-15 min |
| 15 | 0.95 | 0.025 | 0.025 | — | 16.7 | 25° C.-7 kV/mm-15 min |
| 16 | 0.98 | 0 | 0.020 | 358 | 41.8 | — |
| 17 | 0.98 | 0.005 | 0.015 | 358 | 41.2 | 25° C.-8 kV/mm-15 min |
| 18 | 0.98 | 0.015 | 0.005 | 322 | 42.4 | — |
| 19 | 0.96 | 0 | 0.040 | 366 | 35.0 | — |
| 20 | 0.96 | 0.030 | 0.010 | 305 | 41.3 | 25° C.-8 kV/mm-15 min |
| 21 | 0.96 | 0 | 0.040 | 267 | 46.8 | 25° C.-5 kV/mm-15 min |
| 8* | BaTiO$_3$ | | | 120 | 49.30 | — |
| 9* | Na$_{0.5}$LaBi$_{3.5}$Ti$_4$O$_{15}$ | | | 402 | 10.10 | — |

*Comparative example

It is apparent from Table 4 that the samples of the present invention have high Curie temperatures and high electro-mechanical coupling factors.

EFFECT

As has been mentioned above, according to the present invention, there can be realized a lead-free piezoelectric material which exhibit excellent piezoelectric characteristics and are superior from the viewpoints of prevention of environmental pollution, protection of environments and ecology.

We claim:

1. A piezoelectric ceramic composition within a region in a case of being represented by the following formula:

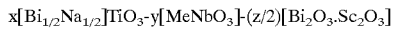
$$x[Bi_{1/2}Na_{1/2}]TiO_3 - y[MeNbO_3] - (z/2)[Bi_2O_3 \cdot Sc_2O_3]$$

wherein Me is K or Na, which satisfies the following conditions:

$x+y+z=1$ $0<x<1$ $0 \leq y<1$ and $0<z<0.5$.

2. The piezoelectric ceramic composition of claim 1, wherein x, y and z are in the ranges satisfying the following conditions:

$0.7 \leq x<1$ $0 \leq y \leq 0.2$ and $0<z \leq 0.3$.

3. The piezoelectric ceramic composition of claim 1, wherein Me is K and x, y and z are in the ranges satisfying the following conditions:

$0<x<0.1$, $0.9 \leq y<1$ and $0<z<0.1$.

4. The piezoelectric ceramic composition of claim 1, wherein crystal grains of the composition have a perovskite structure.

5. The piezoelectric ceramic composition of claim 1, wherein crystal grains of the composition have a mean particle diameter of 0.5–10 μm.

6. The piezoelectric ceramic composition of claim 1, further comprising 0.005–1% by weight of an additive comprising Mn.

7. A method for manufacturing a piezoelectric ceramic composition comprising mixing powders selected from bismuth oxide, scandium oxide, sodium carbonate, potassium carbonate, niobium oxide and titanium oxide to form a mixture; and forming the mixture into the piezoelectric ceramic composition of claim 1.

* * * * *